United States Patent [19]

Tojo

[11] Patent Number: 4,477,770

[45] Date of Patent: Oct. 16, 1984

[54] NOISE FIELD INTENSITY MEASURING APPARATUS

[75] Inventor: Shigeki Tojo, Musashino, Japan

[73] Assignee: Takeda Riken Kogyo Kabushikikaisha, Tokyo, Japan

[21] Appl. No.: 359,137

[22] Filed: Mar. 17, 1982

[30] Foreign Application Priority Data

Mar. 20, 1981 [JP] Japan .................. 56-39780[U]

[51] Int. Cl.$^3$ .................................. G01R 27/00
[52] U.S. Cl. ........................................ 324/57 N
[58] Field of Search ............... 328/144, 145; 324/155, 324/57 N, 132

[56] References Cited

U.S. PATENT DOCUMENTS 3,562,552 2/1971 Baudino ................ 328/144 X
3,835,378 9/1974 Edden .................. 324/57 N X
4,255,706 3/1981 Soojian ................ 328/144 X Primary Examiner—Stanley T. Krawczewicz
Assistant Examiner—Jose M. Solis
Attorney, Agent, or Firm—Staas & Halsey

[57] ABSTRACT

A noise wave is received by a receiver and the received output is supplied to a first signal path composed of a rectifier and a low-pass filter connected to the output side thereof. The received output is applied to a second signal path comprised of an AC amplifier, or a rectifier for rectifying the amplified output, a low-pass filter for filtering the rectified output, and an attenuator for attenuating the filtered output. The outputs from the first and second signal paths are selectively provided to a time constant circuit by means of a switch in accordance with the received noise level. The input to the time constant circuit is converted into a quasi-peak value detected output, which is logarithmically amplified by a logarithmic amplifier and is then provided to an indicator.

13 Claims, 9 Drawing Figures

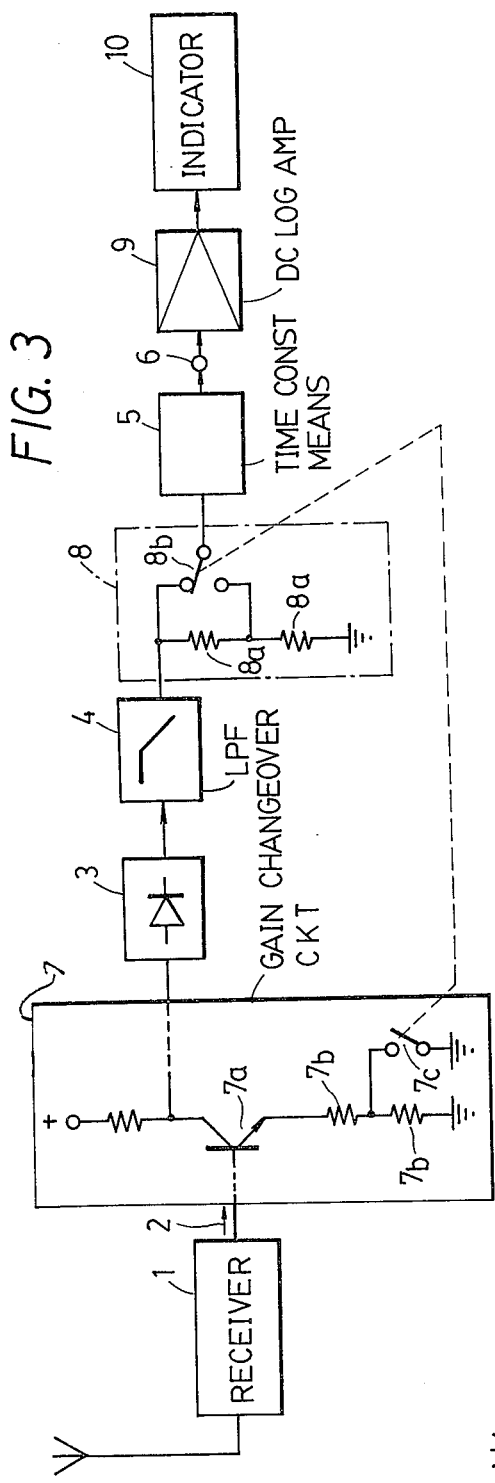

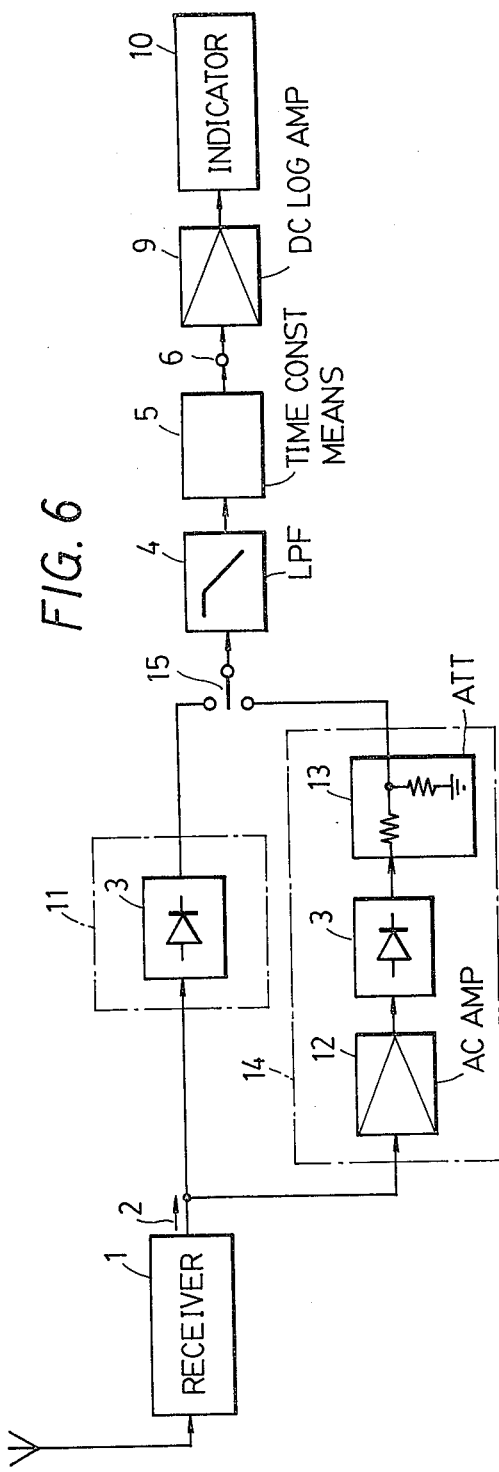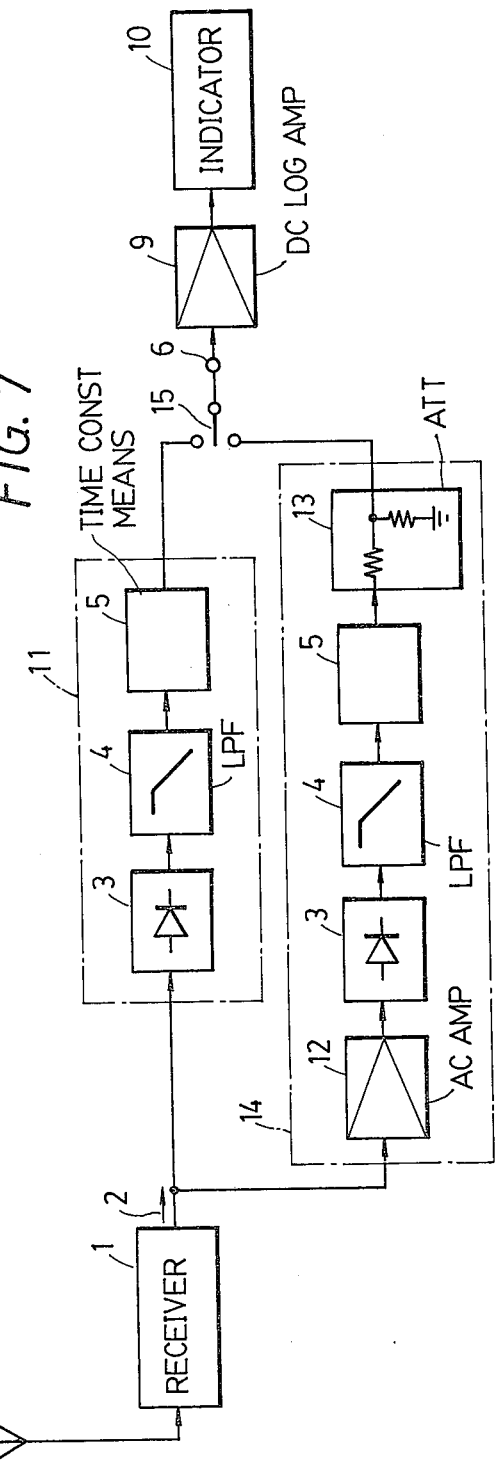

NOISE FIELD INTENSITY MEASURING APPARATUS

BACKGROUND OF THE INVENTION

The present invention relates to a noise field intensity measuring apparatus, and more particularly to a noise field intensity measuring apparatus which is capable of measuring the noise field intensity over a wide range.

In conventional noise field intensity measuring apparatus, a noise wave is received by receiver changing the receiving frequency; an intermediate-frequency signal of the receiver is rectified by a rectifier; a DC component is taken out by a low-pass filter from the rectified output; and then converted by a time constant circuit into a quasi-peak value detected output; and the quasi-peak value detected output is applied to an indicator, such as a CRT display, a meter type indicator or the like, for display of its level. The measurement of such noise field intensity is standardized by the CISPR standard. In such a noise field intensity measuring apparatus, as the dynamic range of the indicator is narrow, the range over which the noise field intensity can be measured is narrow, only 0 to −20 dB or so in terms of input field intensity.

As a solution to this problem, a method that supplies the output from the time constant circuit to a DC logarithmic amplifier to compress the variation range of the input thereto and which applies the output therefrom to the indicator is described with reference to FIG. 5 of U.S. Pat. No. 4,272,719 "Electric Field Intensity Measuring Apparatus" issued on June 9, 1981. With such a method, the field intensity measuring range can be enlarged but, in this case, the dynamic range of the rectifier for rectifying the received intermediate-frequency output is about 40 dB and, under the restriction of such a narrow dynamic range, the field intensity measuring range is enlarged to 0 to −40 dBm only. Accordingly, for further enlargement of the dynamic range for measurement, it has been considered to compress the level of the output signal by an AC logarithmic amplifier at a stage preceding the rectifier while the signal still remains as an AC signal. However, as the AC logarithmic amplifier is complicated in structure and low in accuracy, it is difficult to measure the noise level with high accuracy. In addition, the AC logarithmic amplifier includes a feedback circuit, and hence is poor in response.

It is therefore an object of the present invention to provide a noise field intensity measuring apparatus of wide dynamic range for measurement.

Another object of the present invention is to provide a noise field intensity measuring apparatus which is wide in dynamic range, simple in construction, and inexpensive and excellent in accuracy and response.

SUMMARY OF THE INVENTION

According to the present invention, the gain of an amplifier for amplifying a received noise AC signal from a receiver for receiving a noise wave is made variable, and the amplified output is rectified by a rectifier. In the case where the amplifier gain is increased, the rectified output is attenuated in accordance with the increased gain and is then applied to a time constant circuit for conversion into a quasi-peak value detected output. In this way, when the noise field intensity level is high, the gain of the AC amplifier is made small and the amplified output is supplied directly to the rectifier circuit. When the noise field intensity is low, the gain of the AC amplifier is made large. After being thus brought into the dynamic range of the rectifier, the received noise signal is provided to the rectifier and the rectified output is attenuated, and is then applied to the time constant circuit. With such an arrangement, a rectifier of relatively small dynamic range can be used for a wide range of noise field intensity and, by the use of a variable attenuator, the dynamic range of the rectifier output is enlarged and the rectified output is compressed by a DC logarithmic amplifier and then applied to the indicator, thus providing for enlarged dynamic range of measurement.

For controlling the amplification gain of the AC signal and the attenuation of the rectified output, first and second signal paths are connected at one end to the output side of the receiver and at the other end to a changeover switch, and the DC logarithmic amplifier is connected to the output side of the changeover switch. A rectifier and a low-pass filter supplied with its rectified output are inserted in the first signal path, and an AC amplifier, a rectifier supplied with its amplified output, a low-pass filter for filtering the rectified output and an attenuator for attenuating the filter output are inserted in the second signal path. The time constant circuit for obtaining the quasi-peak value detected output is connected between the abovesaid changeover switch and the DC logarithmic amplifier for use in common to the output signals from both the first and second signal paths. Such a time constant circuit may also be inserted in each of the first and second signal paths. Further, it is also possible to provide a low-pass filter at a stage following the changeover switch in common to both the first and second signal paths instead of providing the low-pass filter in each signal path. The control of the changeover switch may also be adapted to be automatically effected in accordance with the received noise field intensity.

BRIEF DESCRIPTION OF THE DRAWINGS

FIG. 3 is a block diagram illustrating a basic feature of the present invention;

FIG. 4 is a block diagram illustrating an example of the noise field intensity measuring apparatus of the present invention which has two signal paths;

FIG. 6 is a block diagram showing another modification of the apparatus of FIG. 4 in which a low-pass filter is used in common to the signal paths;

FIG. 7 is a block diagram showing another modification of the apparatus of FIG. 4 in which a time constant circuit 5 is inserted in each signal path;

DETAILED DESCRIPTION OF THE PREFERRED EMBODIMENTS

Figure 1:
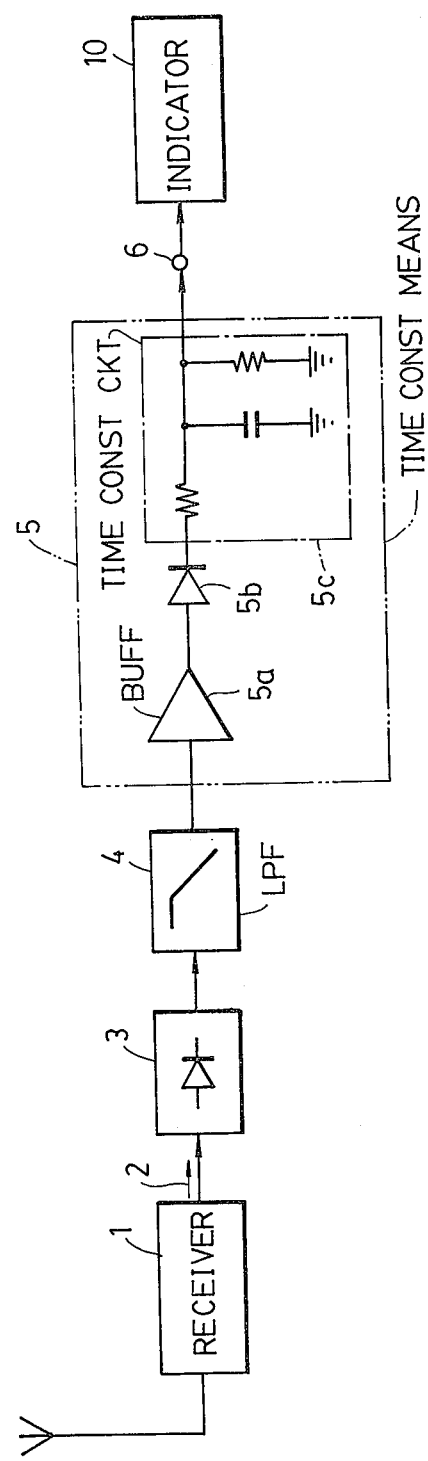
FIG. 1 is a block diagram showing a conventional noise field intensity measuring apparatus.

FIG. 1 illustrates a conventional noise field intensity measuring apparatus. A noise wave to be measured is received by a receiver 1 which is capable of changing the receiving frequency, and an intermediate-frequency signal 2 is taken out from the receiver 1 and is rectified by a rectifier 3. The rectified output from the rectifier 3 is provided to a low-pass filter 4, wherein it is smoothed, that is, irregular level variations of the noise are smoothed, and the smoothed output is applied to a quasi-peak value detecting time constant circuit 5. The quasi-peak value detecting time constant circuit 5 comprises a buffer amplifier 5a of high input impedance and a time constant circuit 5c connected to the output side of the buffer amplifier 5a via a diode 5b for reverse-current blocking use. The time constant of the time constant circuit 5c is determined according to CISPR standard. The output from the low-pass filter 4 is converted into a quasi-peak value detected output in accordance with the time constant of the time constant circuit 5c, and the quasi-peak value detected DC voltage is derived at an output terminal 6. The DC voltage thus obtained at the output terminal 6 corresponds to the field intensity of noise at the frequency selected by the receiver 1.

Figure 2:
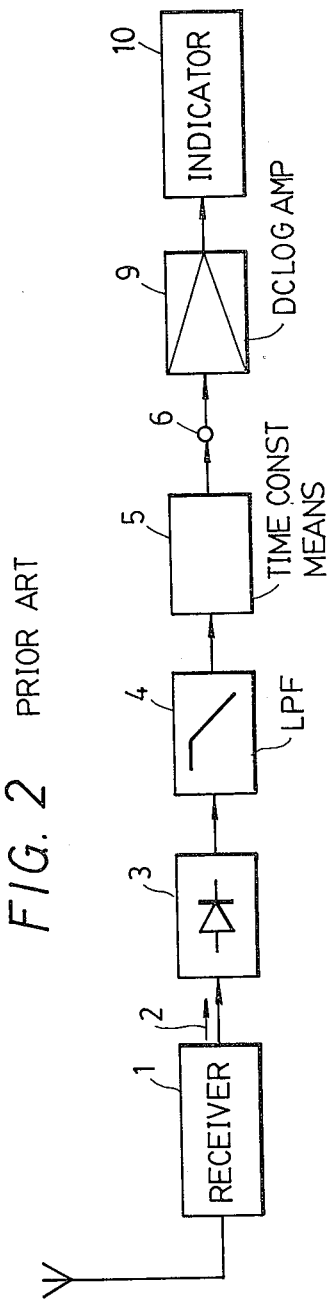
FIG. 2 is a block diagram showing a conventional noise field intensity measuring apparatus employing a DC logarithmic amplifier.
Figure 5:
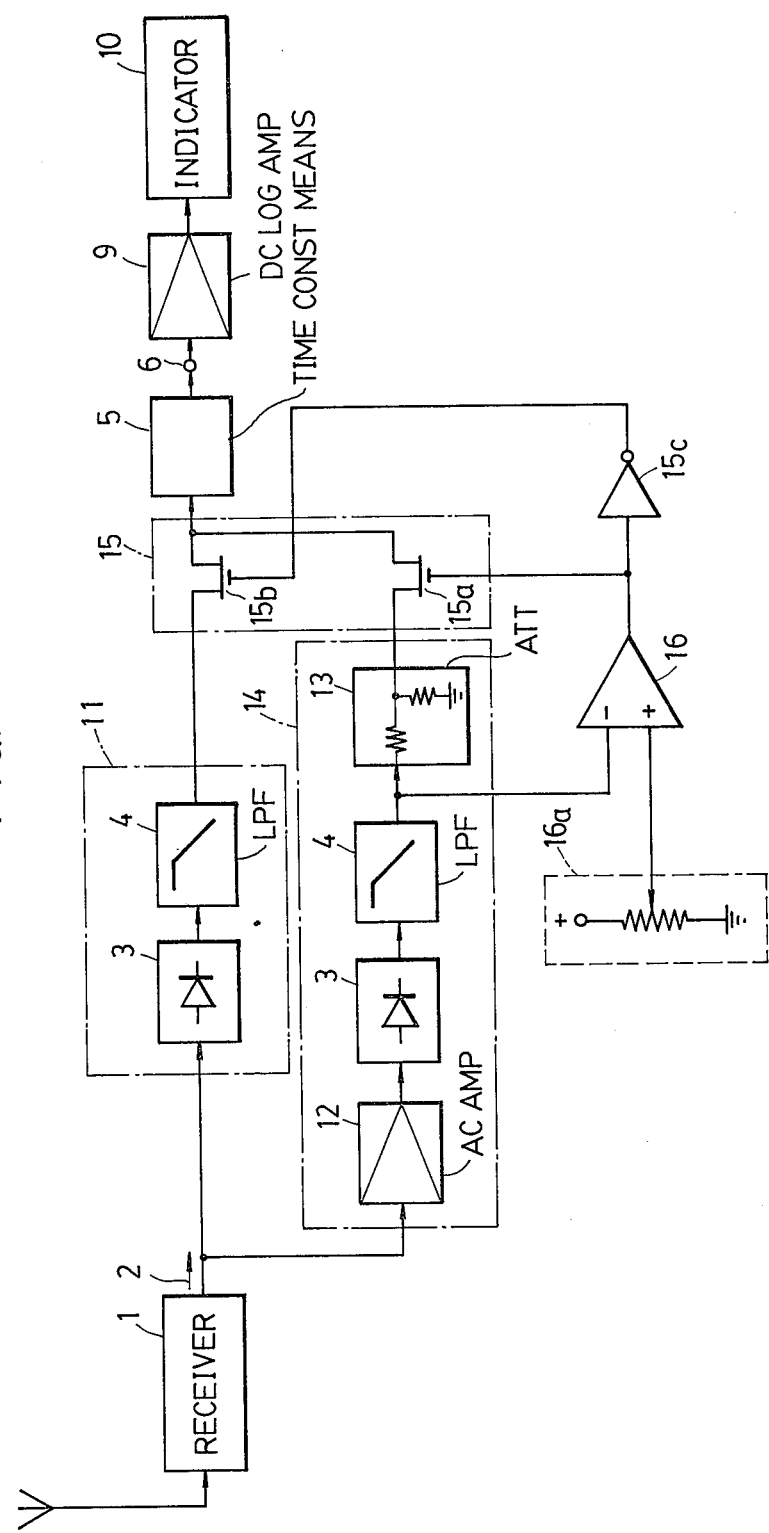
FIG. 5 is a block diagram illustrating a modified form of the apparatus of FIG. 4 in which a switch 15 is adapted for automatic changeover.

The DC voltage available at the output terminal 6 is provided to an indicator 10, for example, a meter-type indicator, or the Y-axis of a CRT display, by which the noise field intensity is displayed. Since the indicator 10 has a narrow dynamic range of about 20 dB, the prior art instrument employs a DC logarithmic amplifier as depicted in FIG. 5 of the aforementioned U.S. patent. That is, as shown in FIG. 2, in which the parts corresponding to those in FIG. 1 are identified by the same reference numerals, the output at the output terminal 6 is applied via a DC logarithmic amplifier 9 to the indicator 10. The DC logarithmic amplifier 9 is relatively simple in construction, high in accuracy and excellent in response and, in addition, it has a wide dynamic range and is capable of sufficiently compressing the input level.

In practice, however, as the dynamic range of the rectifier 3 is narrower than that of the DC logarithmic amplifier 9, the dynamic range over which the noise field intensity can be measured depends upon the dynamic range of the rectifier 4. The dynamic range of the rectifier 3 is usually 40 dB or so though it varies with the characteristics of the diode used, and the measurable noise field intensity is limited only to a dynamic range of from −40 to 0 dBm.

In contrast thereto, by inserting an AC logarithmic amplifier at a stage preceding the rectifier 3 to compress the received noise level, the dynamic range of measurement could be held within the 40 dB dynamic range of the rectifier 3 even if the noise field intensity should vary over a range wider than that between −40 to 0 dBm. In this way, the dynamic range for measurement can be made wider than in the case of employing the DC logarithmic amplifier. However, the AC logarithmic amplifier has the defects of low accuracy, poor response, complicated structure and expensive.

FIG. 3 illustrates an embodiment of the present invention. In FIG. 3, the parts corresponding to those in FIG. 2 are identified by the same reference numerals and no detailed description will be repeated. In this embodiment, a gain switching circuit 7 is provided at the stage preceding the rectifier 3. The gain switching circuit 7 can be formed by an AC amplifier and is arranged so that it can be manually switched between a "gain 1" state and a "gain 40 dB" state. The gain switching circuit 7 is constituted, for instanced, as a common-emitter amplifier, by a transistor 7a and a portion of its emitter resistor 7b can be short-circuited by a switch 7c to increase the gain. At the output side of the low-pass filter 4 is inserted a variable attenuator 8 the attenuation of which is changed in ganged relation to the switching of the gain of the gain switching circuit 7. That is to say, when the gain of the gain switching circuit 7 is 1, the attenuation of the variable attenuator 8 is set to 1 and when the gain of the former is 40 dB, the attenuation of the latter is set to 40 dB. The variable attenuator 8 is arranged so that it is switched by a switch 8b between the attenuation 1 and 40 dB.

When the intermediate-frequency signal from the receiver 1 lies in the range of 0 to −40 dBm in terms of the noise field intensity, the gain of the gain switching circuit 7 and the attenuation of the variable attenuator 8 are respectively set to 1. In the event that the abovesaid intermediate-frequency signal is below −40 dBm in terms of the noise field intensity, the gain of the gain switching circuit 7 and the attenuation of the variable attenuator 8 are both set to 40 dB. In consequence, noise under −40 dBm is amplified by the gain switching circuit 7 by 40 dB and then provided to the rectifier 3. Therefore, even if a noise signal is in the range of −40 to −80 dBm, the corresponding signal applied to the rectifier 3 falls in the dynamic range thereof, and can be rectified.

The rectified output from the rectifier 3 is attenuated by the variable attenuator 8 by 40 dB and then supplied to the quasi-peak value detecting time constant circuit 5. Thus the attenuated output is restored to the level corresponding to the input noise field intensity to yield at the output terminal 6 a DC voltage corresponding to the input noise field intensity. The DC voltage is subjected to logarithmic conversion by the DC logarithmic amplifier 9 and then applied to the indicator 10 for providing thereon an indication of a value corresponding to the input noise field intensity.

Accordingly, this embodiment permits measurement of the noise field intensity in the range of −80 to 0 dBm. In addition, since this embodiment enlarges the measuring range while employing the logarithmic conversion system by the DC logarithmic amplifier 9, a noise field intensity measuring instrument can be constructed at low cost which is excellent in accuracy and response and wide in measuring range.

FIG. 4 shows another embodiment of the present invention. In FIG. 4, the input side of a first signal path 11 formed by the rectifier 3 and the low-pass filter 4 is connected to the output side of the receiver 1, and a second signal path 14 formed by a cascade connection of an AC amplifier 12, the rectifier 3, the low-pass filter 4 and an attenuator 13 is connected to the output side of the receiver 1. The outputs from the first and second signal paths 11 and 14 are selectively supplied via a switch 15 to the quasi-peak value detecting time constant circuit 5. For instance, when the level of the input noise is above −40 dBm, the output from the first signal path 1 is selected and when the input noise level is below −40 dBm, the output from the second signal path 14 is selected.

FIG. 5 illustrates a modified form of the embodiment of FIG. 4. A level decision circuit 16 is provided at the output side of the low-pass filter 4 of the second signal path 14. The output from the low-pass filter 4 and a reference voltage of a reference voltage source 16a are compared by the level decision circuit 16 to decide whether the input noise level is higher or lower than −40 dBm. In the case of the noise level being below −40 dBm, the output from the decision circuit 16 becomes high-level and, by this high-level output, an analog switch 15a formed by an FET in the switch 15 is turned ON, through which the output from the second signal path 14 is supplied to the time constant circuit 5. When the noise level is above −40 dBm, the output from the decision circuit 6 yields a low-level output, which is inverted by an inverter 15c. The inverted output is then applied to a FET switch 15b to turn it ON, permitting the passage therethrough of the output from the first signal path 11 to the time constant circuit 5. In this way, the switch 15 automatically changes over; especially in the case of automatically sweeping the receiving frequency of the receiver 1 and indicating the frequency characteristic of a noise wave by the indicator 10, the switch 15 automatically changes over in the course of rise or fall of the displayed waveform, providing an excellent level display.

In FIG. 6, the low-pass filter 4 is taken out from both of the first and second signal paths 11 and 14, and one low-pass filter 4 is connected between the switch 15 and the time constant circuit 5 so that it is shared by both the signal paths 11 and 14. With such an arrangement, the number of circuit elements used can be reduced.

In FIG. 7, the quasi-peak value detecting time constant circuit 5 is inserted in each of the first and second signal paths 11 and 14, and a switch 15 is connected to the output side of each quasi-peak value detecting time constant circuit 5.

Figure 8:
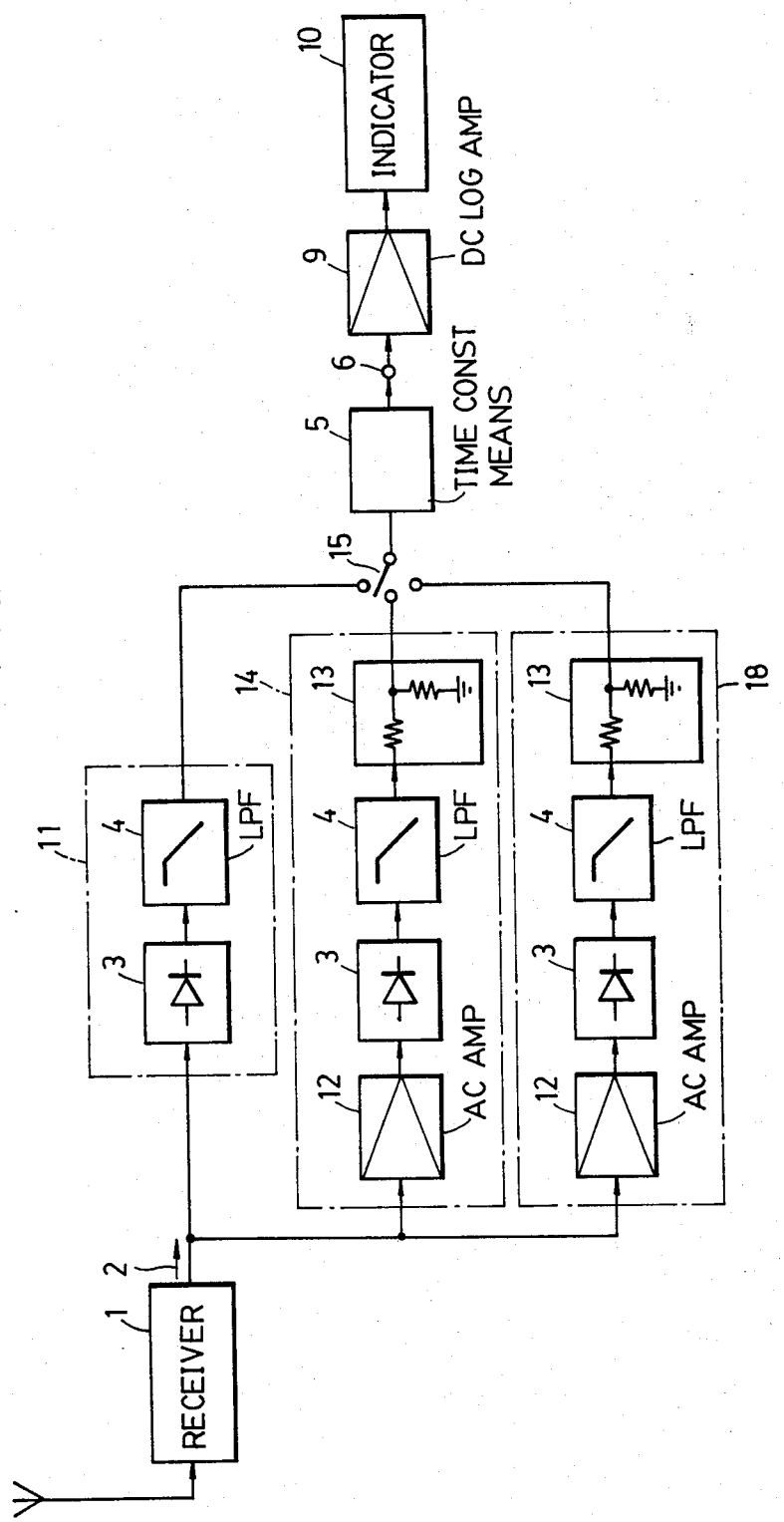
FIG. 8 is a block diagram showing another embodiment of the present invention which employs three signal paths.
Figure 9:
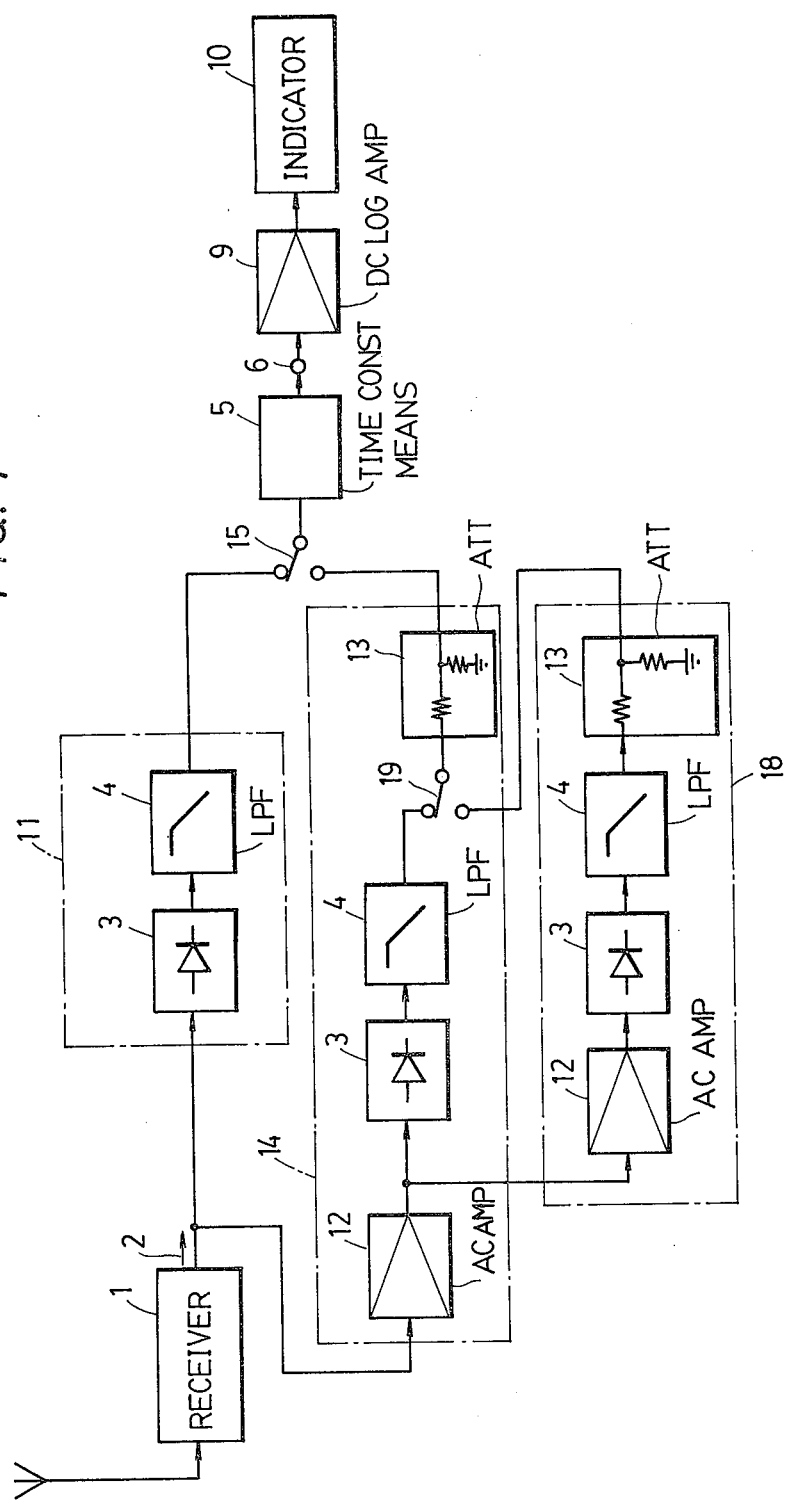
FIG. 9 is a block diagram illustrating a modified form of the apparatus of FIG. 8 in which a third signal path is partly formed in common to a second signal path.

When it is desired to further enlarge the dynamic range for measurement, the number of signal paths is increased as required. For instance, as shown in FIG. 8, the input side of a third signal path 18 is connected to the output side of the receiver 1 and the gain of the AC amplifier 12 of the third signal path 18 is set to 80 dB and, further, the attenuation of the attenuator 13 for attenuating the output from the amplifier 12 after being rectified is set to 80 dB. Any one of the outputs from the first, second and third signal paths 11, 14 and 18 is selected by the changeover switch 15 and then applied to the time constant circuit 5. Also, in the example of FIG. 8, the arrangement of each signal path may be modified as depicted in FIGS. 6 and 7. Further, as illustrated in FIG. 9, the output side of the receiver 1 is connected to the input side of the third signal path 18 via the AC amplifier 12 of the second signal path 14, and the output side of the third signal path 18 is connected via a changeover switch 19 to the input side of the attenuator 13 of the second signal path 14. The gain of the AC amplifier 12 of the third signal path 18 is selected to be 40 dB, for instance, and the attenuation of the attenuator 13 is set to 40 dB. Such modifications, such as for sharing the amplifier and the attenuator by the second and third signal paths 14 and 18, can be effected as required.

Moreover, the arrangements of FIGS. 6 to 9 may also be modified so that the switch 15 is automatically controlled for automatically selecting one of the outputs from the signal paths in accordance with the received noise level as described previously in respect to FIG. 5. A decision based on the received noise level for controlling the switch 15 may also be carried out at any place on the side preceding the filter 4. In any embodiments described above, the attenuator 13 can be inserted at any place between the output side of the rectifier 3 and the switch 15. The gain of the AC amplifier 12 and the attenuation of the attenuator 13 need not always be equal to each other.

As has been described in the foregoing, according to the present invention, the noise field intensity can be measured with high accuracy and excellent response by performing logarithmic conversion through the use of the DC logarithmic amplifier 9 and, in addition, the measuring range can be enlarged; therefore, the present invention is of great utility in practical use. Moreover, the arrangement can be constituted by merely adding such existing circuits as the detector 3, the low-pass filter 4 and so forth to the AC amplifier and the attenuator, and hence it can be obtained at low cost.

While in the foregoing the gain of the AC amplifier is described to be 40 dB, it will easily be understood that the gain is not limited specifically to this value.

It will be apparent that many modifications and variations may be effected without departing from the scope of the novel concepts of this invention.

I claim:

1. A noise field intensity measuring apparatus adapted for enlarging the measuring dynamic range, comprising
    a receiver capable of changing its receiving frequency;
    at least first and second signal paths respectively having the input sides thereof connected to the output side of the receiver;
    changeover switching means connected to the output sides of said signal paths, for selectively taking out output signals thereof;
    a first rectifier inserted in series in the first signal path, for rectifying the output from the receiver;
    an AC amplifier inserted in series in the second signal path, for amplifying with a gain value G the output from the receiver;
    a second rectifier inserted in series in the second signal path at the output side of the AC amplifier, for rectifying the amplified output from the AC amplifier;
    an attenuator inserted in the second signal path at the stage following the second rectifier, for attenuating with an attenuation value equal to said gain value G a signal corresponding to the rectified output from the second rectifier;
    low-pass filter means supplied with a signal corresponding to the rectified output from the one of said first and second rectifiers selected by said changeover means, to take out its DC component;
    time constant circuit means for converting the output from the low-pass filter means corresponding to the signal path selected by said changeover means into a quasi-peak value detected output;
    a DC logarithmic amplifier for logarithmically amplifying the quasi-peak value detected output from the time constant circuit means; and
    an indicator supplied with the output from the AC logarithmic amplifier to display its magnitude 2. A noise field intensity measuring apparatus according to claim 1 wherein the low-pass filter means is a low-pass filter provided at the output side of the changeover switching means and serving in common to the first and second signal paths.

3. A noise field intensity measuring apparatus according to claim 1 wherein the low-pass filter means is first and second low-pass filters respectively inserted in the first and second signal paths at the stages following the first and second rectifiers, and wherein the time constant circuit means is a time constant circuit provided at the stage following the changeover switching means and serving in common to the outputs from the first and second low-pass filters.

4. A noise field intensity measuring apparatus according to claim 1 wherein the low-pass filter means is first and second low-pass filters respectively inserted in the first and second signal paths at the stages following the first and second rectifiers, and wherein the time constant circuit means is first and second time constant circuits respectively inserted in the first and second signal paths at the stages following the first and second low-pass filters.

5. A noise field intensity measuring apparatus according to claim 1 which further includes a third signal path having its input side connected to the output side of the receiver and having its output side connected to the changeover switching means, a second AC amplifier inserted in series in the third signal path for amplifying the output from the receiver, a third rectifier inserted in the third signal path at the output side of the second AC amplifier for rectifying the amplified output therefrom, and a second attenuator inserted in series in the third signal path at the stage following the third rectifier for attenuating the rectified output therefrom, and wherein the low-pass filter means is selectively supplied with the rectified output from the third rectifier.

6. A noise field intensity measuring apparatus of claim 1, 2, 3 or 4 which includes control means for detecting the output level of the receiver and controlling the changeover switching means to connect it to the first signal path or the second signal path depending upon whether the detected output level of the receiver is above or below a predetermined value.

7. A noise field intensity measuring apparatus adapted for enlarging the measuring dynamic range, comprising;
a receiver capable of changing its receiving frequency;
a variable-gain AC amplifier of selected gain value G connected to the output side of the receiver, for amplifying the output from the receiver;
a rectifier connected to the output side of the variable-gain AC amplifier, for rectifying the amplified output therefrom;
a low-pass filter connected to the output side of the rectifier, for taking out a DC component from the rectified output from the rectifier;
a variable attenuator of selected attenuation value G equal to said gain value G of said variable-gain AC amplifier, connected to the output side of the low-pass filter, for attenuating the filtered output therefrom;
a time constant circuit connected to the output side of the variable attenuator, for converting the attenuated output therefrom into a quasi-peak value detected output;
a DC logarithmic amplifier connected to the output side of the time constant circuit, for logarithmically amplifying the output therefrom; and
an indicator connected to the output side of the DC logarithmic amplifier, for displaying the magnitude of the output therefrom.

8. The apparatus of claim 5, comprising control means for detecting the output level of the receiver and for controlling the changeover switching means to connect it to an appropriate one of said three signal paths depending upon the detected output level of the receiver.

9. The apparatus of claim 7, comprising means for selecting said gain value G and said equal attenuation value in correspondence to the intensity of said noise field.

10. A noise field intensity measuring apparatus adapted for enlarging the measuring dynamic range, comprising
a receiver capable of changing its receiving frequency to provide a respective output for measuring said noise field;
at least first and second parallel signal paths for receiving as inputs the output of the receiver;
changeover switching means for selecting which of said parallel signal paths is to be used for providing an output for measuring said noise field in correspondence to said output of said receiver;
a first rectifier inserted in series in the first signal path, for rectifying the output from the receiver;
an AC amplifier inserted in series in the second signal path, for amplifying with gain value G the output from the receiver;
a second rectifier inserted in series in the second signal path at the output side of the AC amplifier, for rectifying the amplified output from the AC amplifier;
an attenuator inserted in the second signal path to receive a signal corresponding to the output of the second rectifier, for attenuating with an attenuation value equal to said gain value G said signal corresponding to the output from the second rectifier,
low-pass filter means connected to receive a signal corresponding to the output of selected one of said first and second rectifiers, to output the respective DC component;
time constant means for receiving each said output of the low-pass filter and for providing a corresponding output signal;
a DC logarithmic amplifier for logarithmically amplifying the quasi-peak value detected output from the time constant circuit means; and
an indicator supplied with the output from the AC logarithmic amplifier to display its magnitude;
wherein the intensity of said noise field is matched to the dynamic range of a respective one of said first and second rectifiers for providing said enlarging of said measuring dynamic range.

11. A noise field intensity measuring apparatus according to claim 10 wherein the low-pass filter means is a low-pass filter which is connected to the output of the changeover switching means and serves in common to all of said signal paths.

12. A noise field intensity measuring apparatus according to claim 10 wherein the low-pass filter means comprises a respective low-pass filter inserted in each said signal path to receive a signal corresponding to the output of the respective rectifier, and wherein the time constant circuit means is a time constant circuit which is connected to receive a signal corresponding to the output of the signal path selected by said changeover switching means and serves in common to all of said signal paths.

13. A noise field intensity measuring apparatus according to claim 10 wherein the low-pass filter means comprises a respective low-pass filter inserted in each said signal path to filter the respective output of the respective rectifier, and wherein the time constant circuit means comprises a respective time constant circuit inserted in each said signal path to receive the output of the respective low-pass filter.

* * * * *